United States Patent [19]
Dunne

[11] 3,924,230
[45] Dec. 2, 1975

[54] SYNCHRO-TO-DIGITAL CONVERTER ARRANGEMENT FOR MANIPULATOR APPARATUS

[75] Inventor: Maurice J. Dunne, Newtown, Conn.

[73] Assignee: Unimation, Inc., Danbury, Conn.

[22] Filed: Feb. 15, 1974

[21] Appl. No.: 442,862

[52] U.S. Cl. ....... 340/347 SY; 340/347 DA; 328/14
[51] Int. Cl.² .......... H03K 13/00
[58] Field of Search ............ 340/347 DA, 347 SY, 347 AD; 328/14; 321/9

[56] References Cited

UNITED STATES PATENTS

| | | | |
|---|---|---|---|
| 3,335,417 | 8/1967 | Adler et al. | 340/347 SY |
| 3,537,099 | 10/1970 | Johansson | 340/347 SY |
| 3,544,906 | 12/1970 | Dulaney et al. | 328/14 |
| 3,838,414 | 9/1974 | Wiles | 328/14 X |
| 3,849,774 | 11/1974 | Barth | 340/347 SY |

*Primary Examiner*—Charles D. Miller
*Attorney, Agent, or Firm*—Mason, Kolehmainen, Rathburn & Wyss

[57] ABSTRACT

The continuously varying digital output of an electronic counter is applied to a digital-to-analog converter of the multi-level ladder network type and a series of function generators are associated with individual levels of this network to provide successive straight line segments of a composite waveform which closely approximates a sinusoidal wave. This sinusoidal waveform is employed directly as the energizing voltage for a synchro generator the position of whose input shaft is to be digitized. The phase shifted output of the synchro generator is applied to a phase detector which produces an output pulse corresponding to the zero crossover point of the phase shifted output and the zero crossover pulse developed by the phase detector is employed to control a holding register which is continuously supplied with the count of the original electronic counter which was employed to develop the sinusoidal waveform. Accordingly, an exact digital representation is developed by this holding register corresponding to the zero crossover point of the phase shifted waveform and provides a digitized output representative of the position of the input shaft of the synchro generator.

A number of such synchro generator arrangements are also employed to measure the individually controlled axes of a programmable manipulator, the electronic counter, phase detector and holding register being common to all axes of the manipulator apparatus. During the record or teaching phase of the manipulator apparatus two holding registers are employed and the comparator normally used during playback is used during the recording mode to compare the outputs of both registers before a signal is recorded in the memory operation of the manipulator apparatus. Also, during the playback mode of operation of the manipulator apparatus, the two registers are used alternately to store a digitized synchro output or to supply a previously stored output to a comparator for comparison with the command signal. With this arrangement, the updating of individual axes of the manipulator is substantially increased.

6 Claims, 6 Drawing Figures

SYNCHRO-TO-DIGITAL CONVERTER ARRANGEMENT FOR MANIPULATOR APPARATUS

Figure 1A:
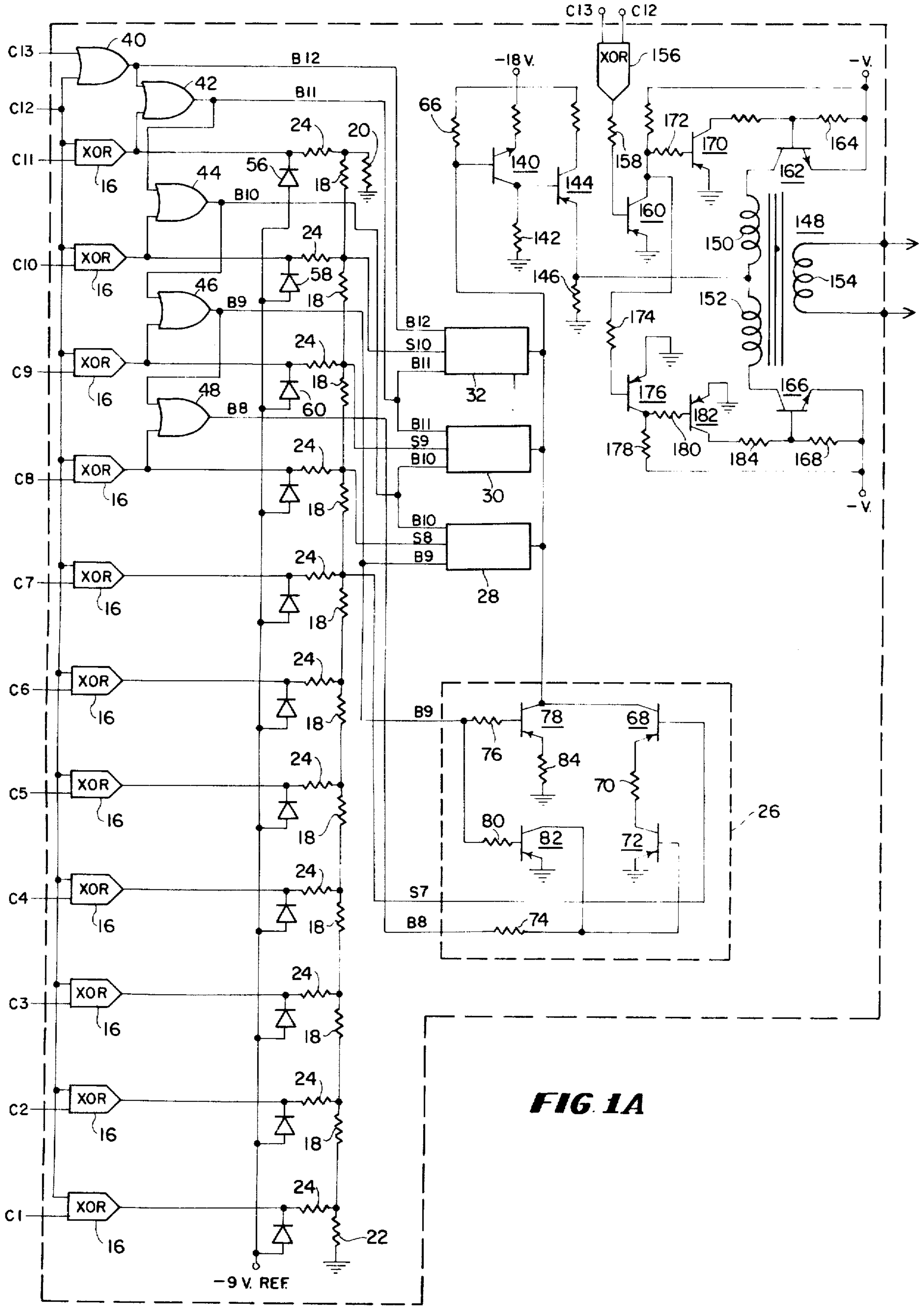

The present invention relates to analog-to-digital converters and, more particularly, to a synchro-to-digital converter arrangement which may be employed in both the record and teach modes of a programmable manipulator apparatus. While the synchro-to-digital converter arrangement of the present invention is of general application, it has certain advantages in connection with and will be described in the specification in relation to a programmable manipulator apparatus.

Various synchro-to-digital converter arrangements have been employed in the past to provide a numerically coded or digitized output corresponding to the position of the input shaft of a synchro generator. In one such prior art arrangement an electronic counter is employed to generate a square wave and the fundamental or sinusoidal component of this square wave is extracted by passive filter networks. The fundamental component is then amplified and employed as a power source for the stator of the synchro generator and also as a reference sine wave. The output sinusoidal wave developed in the rotor of the synchro generator, which is shifted in phase with respect to the reference wave an amount proportional to input shaft movement, is then correlated with a particular count of the electronic counter by detecting the zero crossover point of the shifted synchro output signal with respect to the reference wave. However, due to various factors, such as thermal drift and the like, the zero cross-over point of both the reference wave and the phase shifted output signal are not exactly correlatable with a particular count in the electronic counter. Accordingly, the accuracy with which the digitized output can be made to represent input shaft position is quite limited in these prior art arrangements.

The accuracy with which a digitized output can be made to represent shaft position is particularly important in connection with manipulator apparatus wherein a manipulator arm may have to be moved over distances of several feet to an accuracy of a few thousandths of an inch. However, it is desirable to utilize synchro-to-digital converters in the control of the various axes of a programmable manipulator since this type of position indicating and sensing is somewhat more economical than the photoelectric encoders now employed in some types of accurately positionable manipulator apparatus.

It is, therefore, an object of the present invention to provide a new and improved synchro-to-digital converter arrangement which avoids one or more of the above-discussed disadvantages of prior art arrangements.

It is a further object of the present invention to provide a new and improved synchro-to-digital converter arrangement which is particularly suited for use with programmed manipulator apparatus.

It is a still further object of the present invention to provide a new and improved synchro-to-digital converter in which the input shaft position can be digitized to a high degree of accuracy.

It is another object of the present invention to provide a new and improved synchro-to-digital converter arrangement wherein the reference wave form is constructed from the output of a digital electronic counter in such manner that the zero crossover points on the reference wave represent a precise digital output of the counter during successive cycles of the reference wave form and independently of temperature drift and the like.

It is a still further object of the present invention to provide an analog-to-digital converter arrangement wherein a synchro generator is energized from a suitable alternating current source and the zero crossover points of the phase displaced output wave of the synchro are alternately stored in two registers, the output of these registers being compared so that errors in detection of the zero crossover points are avoided.

It is a further object of the present invention to provide an analog-to-digital converter wherein the continuously varying output of an electronic counter is first applied to a digital to analog converter in such manner as to construct a generally sinusoidally shaped repetitive wave form, this wave form then being used to excite a synchro generator the phase shifted output of which is converted to the desired digital value by determining the digital output of the electronic counter at a predetermined point on the constructed sinusoidal wave form, such as the zero crossover point thereof.

It is a further object of the present invention to provide a control system for a programmable manipulator in which the manipulator arm is movable in a plurality of axes and movement in different axes is measured by generating a repetitive wave form displaceable from a reference wave form and employing a phase detector and holding register common to all axes for sequentially detecting zero crossover points of the wave forms generated for each axis and sequentially registering a digital value corresponding thereto.

It is another object of the present invention to provide a control system for a programmable manipulator in which the arm is moved to a desired position during a teaching mode of the manipulator and reference wave forms are generated representing the position of the arm in each of several controlled axes; the wave forms are digitized, and facilities are provided for preventing false digitization in each axis.

It is still another object of the present invention to provide a new and improved control system for a programmable manipulator wherein the manipulator arm is moved to a desired position during the teaching mode of the manipulator and the output of a synchro generator is then digitally registered in two registers during successive cycles of the synchro generator output wave the digital output of these two registers being compared and facilities are provided for recording the digital output of one of these registers only when the outputs of both registers compare equally.

It is further object of the present invention to provide a new and improved control system for a programmable manipulator wherein a command signal representing a desired position in a plurality of axes is developed, synchro generators are employed to measure movement of the manipulator arm toward the desired position in each axis, a phase detector common to all axes is employed to determine the zero crossover points of the synchro generator outputs, and two registers are provided for digitally storing the zero crossover points of two axes, the output of one register being compared with the corresponding command signal while the zero crossover point for another axis is being stored in the other register, and vice versa.

Considering briefly the present invention, in accordance with one aspect thereof a continuously varying digital output of an electronic counter is applied to a digital-to-analog converter of the multi-level ladder network type which is arranged to develop an analog output voltage having a wave form closely approximating one quadrant of a sinusoid during a first portion of the total counting time of the counter. This initial quadrant corresponds to the fourth quadrant of a conventional sinusoid, i.e., when the wave changes from full negative value to its mid-point or zero value. During the next portion of the total count the direction of counting applied to the ladder network is reversed and the polarity of the analog output voltage is reversed so that the analog output voltage increases in a wave form closely approximating the first quadrant of a conventional sinusoid. During the next portion of the total count the original counting direction is restored but the reverse polarity of the analog output voltage is maintained so that the output wave form decreases in a manner which closely approximates the second quadrant of a conventional sinusoid. During the final portion of the total count, the direction of the counting and polarity are both reversed so that the output wave form closely resembles the third quadrant of a conventional sinusoid. These counting portions are then repetitively reproduced so that a sinusoidal analog output voltage is developed by the digital-to-analog converter, the zero crossover points of this sinusoidal wave form occurring in exact synchronism with certain digital outputs of the counter since the sinusoidal output wave form has been constructed by starting at points corresponding to these digital outputs.

The developed sinusoidal wave form is then employed directly as the energizing voltage for a synchro generator the position of whose input shaft is to be digitized. The phase shifted output of this synchro generator is then applied to a phase detector which produces an output pulse the timing of which with respect to the originally constructed sinusoidal wave form provides an indication of the phase shift which has been accomplished in the synchro generator.

The zero crossover point of the phase shifted synchro generator signal may be detected by suitable means and the output pulse thus developed is employed to control a holding register which is continuously supplied with the count of the original electronic counter which was employed to develop the sinusoidal wave form. Accordingly, an exact digital representation is developed by this holding register corresponding to the zero crossover point of the phase shifted wave form and hence provides a digitized output representative of the position of the input shaft of the synchro generator.

In accordance with a further phase of the invention, a number of such synchro generator arrangements are employed for the individually controlled axes of a programmable manipulator and the electronic counter, phase detector and holding register are common to all axes of the manipulator apparatus, the individual synchro generator outputs being sequentially applied to the phase detector and holding register through a suitable multiplexing arrangement.

In accordance with a still further aspect of the invention, two holding registers are employed, and the output of the phase detector is sequentially applied to both holding registers during the time period that the synchro generator output is to be digitized. The outputs of these two holding registers are applied to a comparator and only when both holding registers contain equal numbers is a signal given to record the digitized position of the input shaft of the synchro generator in a suitable memory storage arrangement. With such an arrangement slight differences in the position of the zero crossover point in successive cycles of the synchro generator output, which may be due to noise impulses or the like, are prevented from causing a false digital representation to be stored in the memory during the teaching phase of the manipulator apparatus.

During the playback mode of operation of the manipulator apparatus, the command signal derived from the memory is then compared with the digitized output of the synchro generator by again employing a phase detector and holding register common to all axes of the manipulator apparatus. In addition, a second holding register is employed to which the output of the phase detector is alternately applied, and the digital representations of each holding register are successively compared with different command signals corresponding to the command positions in different axes of the manipulator arm. One register is loaded with the digitized output of one synchro generator while the output of another generator, which is already stored in the other register, is compared to the command signal. Such an arrangement increases the sampling rate at which a number of axes may be updated so that the manipulator arm may be precisely positioned in all axes.

Figure 1B:
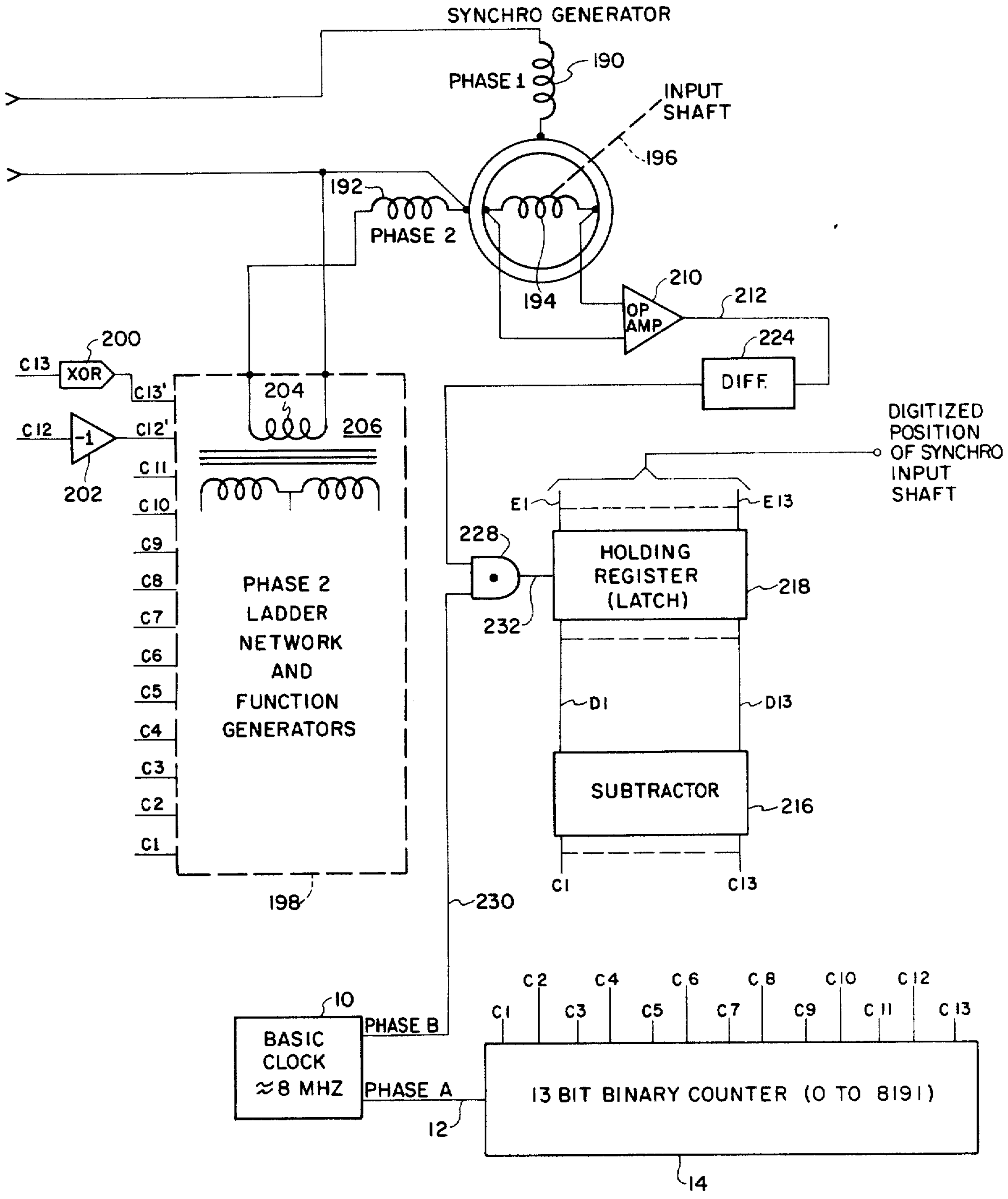
Figure 2:
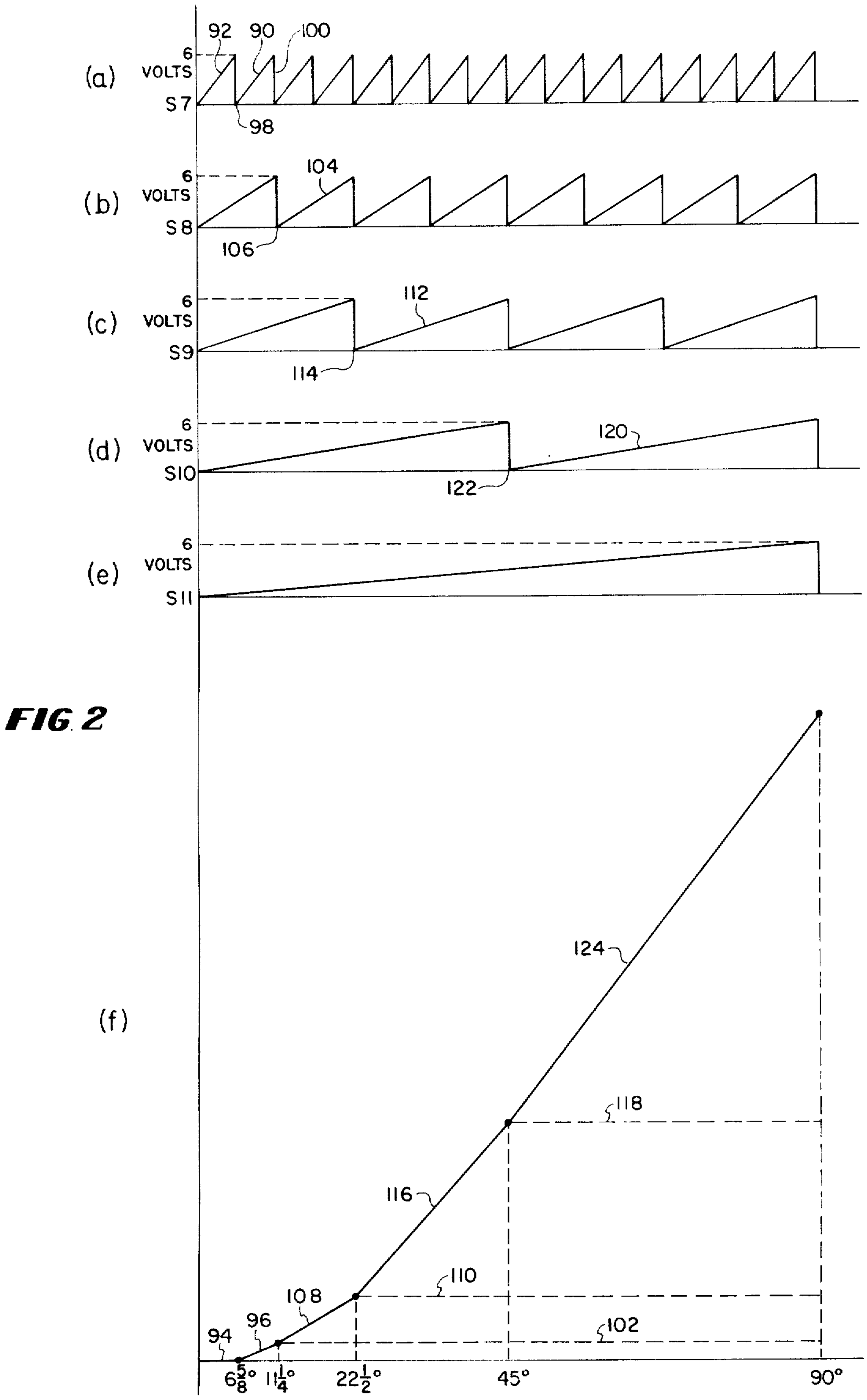
Figure 3:
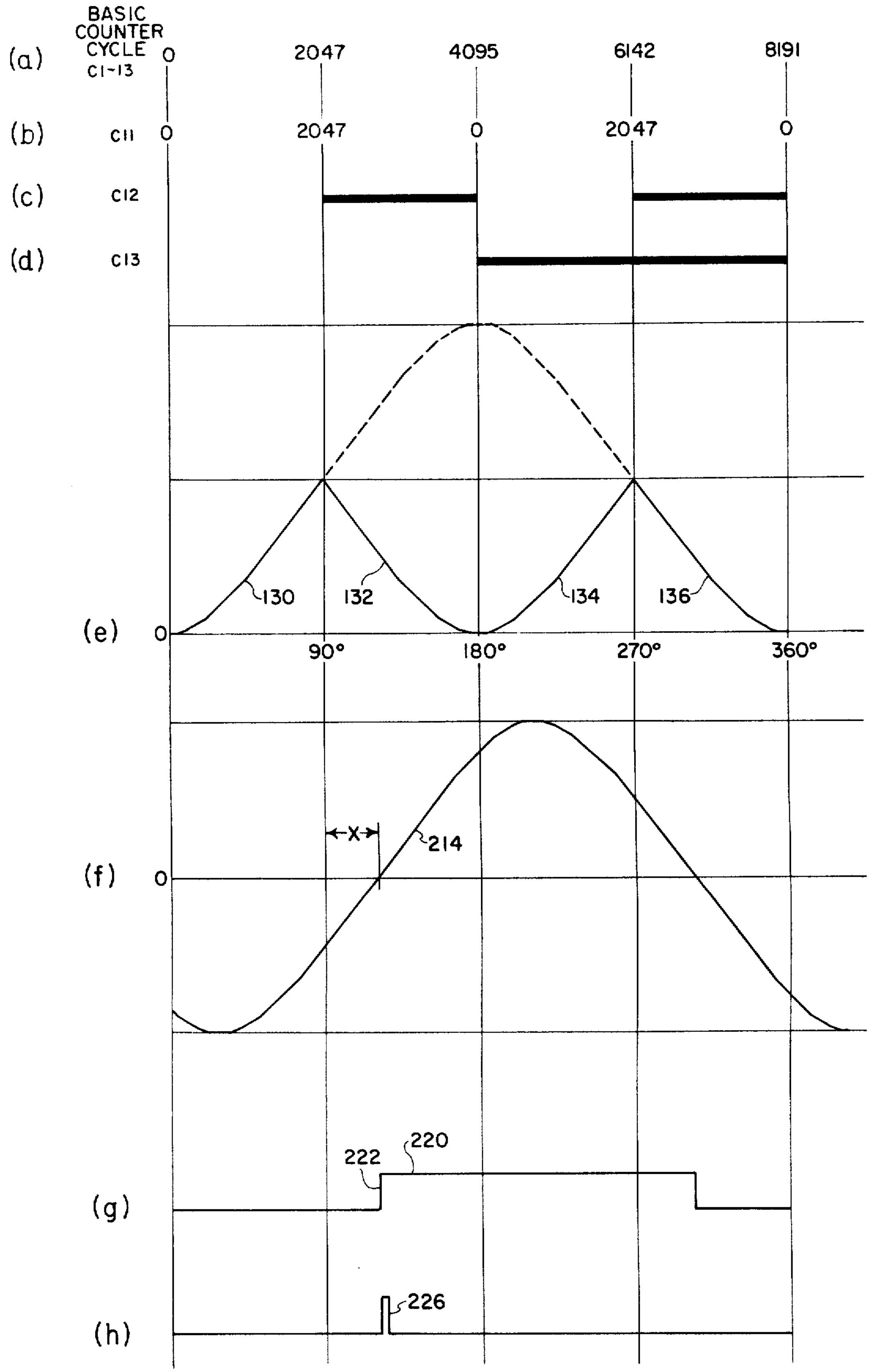
Figure 4A:
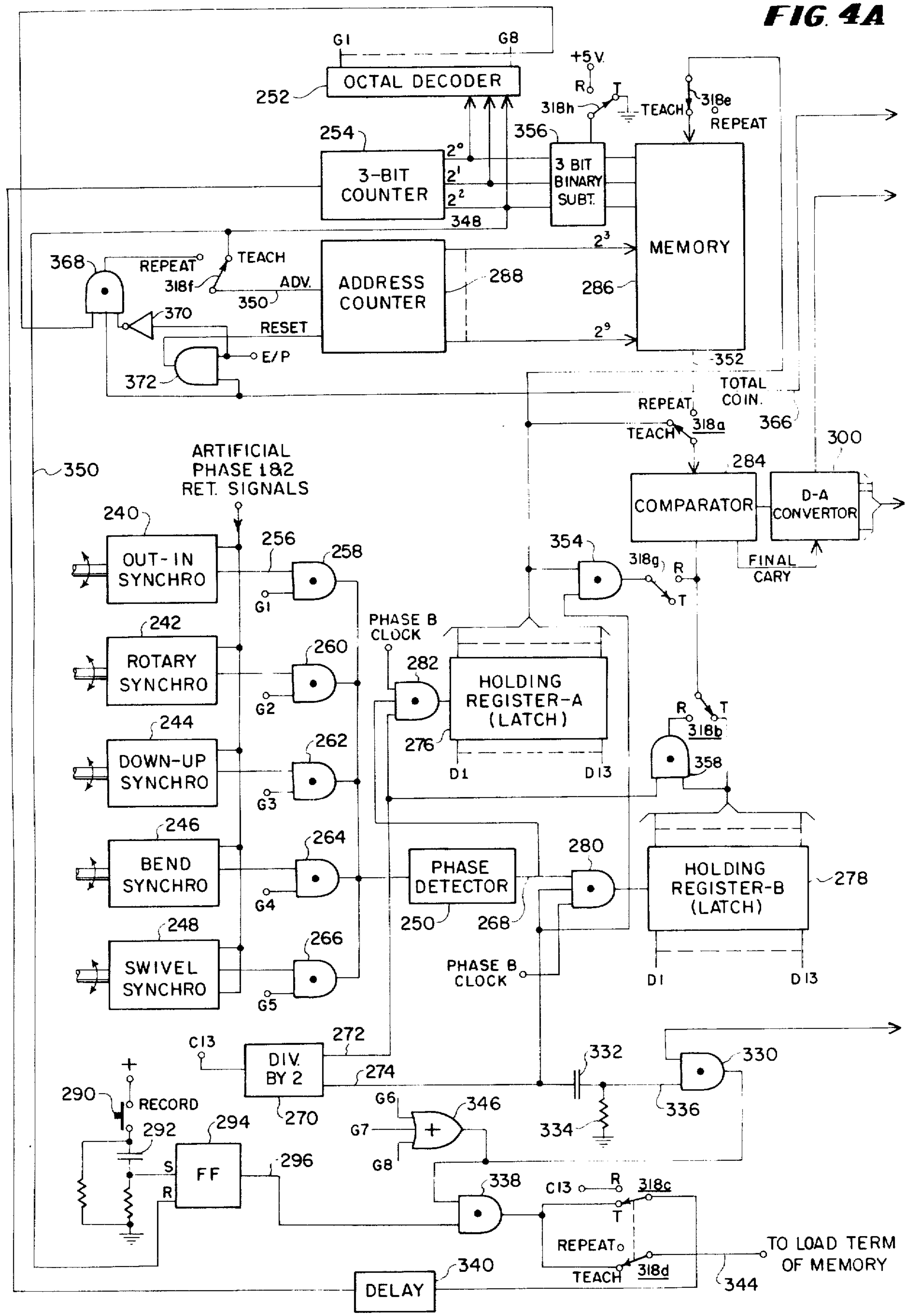
Figure 4B:
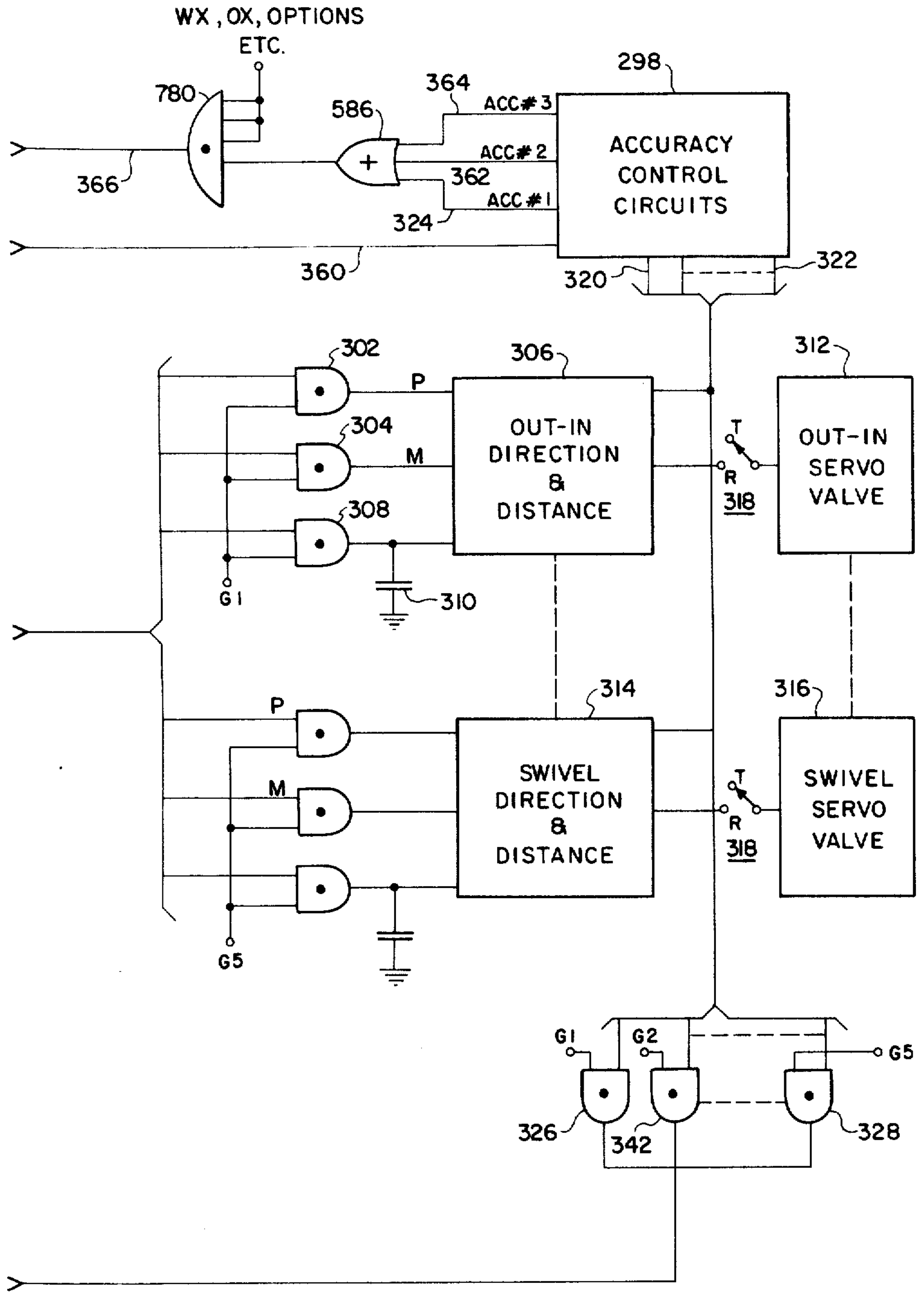

The invention, both as to its organization and method of operation, together with further objects and advantages thereof, will best be understood by reference to the following specification taken in connection with the accompanying drawings in which:

FIGS. 1A and 1B, when placed side by side, comprise a schematic diagram illustrating the improved analog-to-digital converter arrangement of the present invention;

FIGS. 2 and 3 are timing diagrams illustrating various wave forms developed in the circuit of FIGS. 1A and 1B; and FIGS. 4A and 4B, when placed side by side, comprise a schematic logic diagram, partly in block diagram form, of a control system for a programmable manipulator embodying the features of the present invention.

Referring now to the drawings and considering first FIGS. 1A, 1B, 2 and 3 thereof, a basic clock 10, preferably operating at a frequency in the order of 8mhz, continuously supplies output pulses on its phase A output conductor 12 to a 13 bit binary counter 14. As a result the counter 14 continuously produces on its 13 output conductors C1 to C13, inclusive, a binary number which increases from 0 up to a count of 8,191 and then continuously repeats this cycle. In accordance with the invention, the first 11 output conductors, i.e., C1 to C11, inclusive, of the counter 14 are employed in a modified digital to analog converter arrangement, and in conjunction with certain function generators to be described in more detail hereinafter, to develop an analog voltage having a wave form closely approximating one quadrant of a sinusoidal wave.

More particularly, each of the output conductors C1 to C11, inclusive, of the counter 14 is supplied individually to one input of an exclusive XOR-gate 16 to the other input of which is commonly connected the counter signal appearing on the output conductor C12 of the counter 14. During the period when the counter 14 is counting up to the value represented by C11, i.e., a count of 2,047, the voltage on the conductor C12 is low and hence the C1 to C11 signals are transmitted directly through the XOR-gates 16 to the various levels of a ladder network comprising a series of resistors 18, this chain of resistors being connected to ground at the upper end thereof through a resistor 20 and at the bottom end thereof through a similar resistor 22. The output of each XOR-gate 16 is connected through a resistor 24 to the corresponding point on the chain of resistors 18. The resistors 20, 22 and 24 all preferably have a value of 2R and the resistors 18 have a value of R.

In order to stabilize all of the digital signals derived from the counter 14, each of the output conductors thereof is clamped to a stabilized reference voltage of minus nine volts. More particularly, a diode 56 is connected between the output of the XOR-gate 16 and a stabilized minus 9 volt supply so that even though the digital signal on the conductor C11 varies over relatively wide limits, exactly minus nine volts is applied to the resistor 24 when a binary 1 signals appears at the C11 conductor. In a similar manner all of the other conductors C1–C10 are similarly clamped to the reference supply through similar diodes 58, 60, etc.

In the absence of other circuitry, the ladder network 18, 20, 22 and 24 would function to develop a linear or straight line analog output voltage which would increase at each level of the ladder network as the count of the counter 14 increases from C1 to C11. However, as stated above, it is desired in accordance with the present invention to produce an analog output wave form which corresponds closely to a 90° portion of a sinusoidal wave and specifically to the last quadrant of such a wave wherein the instantaneous value of the wave goes from a maximum negative value to a midpoint or zero value. To this end, a series of function generators 26, 28, 30 and 32 are individually associated with certain levels of the ladder network 18–24, the first function generator 26 being associated with the seventh level of the ladder network, i.e., at a point which approximates 6⅝° from the maximum negative point on the desired sinusoidal wave form. No function generators are provided below the C7 level since in the area up to 6⅝° a sine wave can be approximated by a flat voltage segment.

A generally similar ladder network and function generator arrangement is disclosed in Dunne et al. U.S. Pat. No. 3,661,051 issued May 9, 1972 and reference may be had to said patent for a detailed description of such network and function generator arrangement. However, in the said Dunne et al. patent the ladder network and function generators are employed to develop a parabolic error — position signal from the digital output of a comparator whereas in the present arrangement, as discussed above, it is desired continuously to develop ninety-degree segments of a sinusoidal wave form in response to the continuously varying output of the binary counter 14. While reference may be had to the said Dunne et al patent for a detailed description of the function generators 26 to 32, inclusive, for the purpose of the present invention it may be stated that a chain of OR-gates is connected from the most significant digit C13 of the counter 14 down to the level C8. More particularly, a first OR-gate 40 has its inputs connected to the C12 and C13 conductors, the output of the OR-gate 40 acting as one input of an OR-gate 42 the other input of which is the output of the XOR-gate 16 supplied from the C11 conductor. In a similar manner, the OR-gates 44, 46 and 48 are connected in a similar series, the output of each of the OR-gates 40 to 48, inclusive, being identified as a bounds conductor B12 to B8, inclusive, which function to establish a series of "bounds" or boundary conditions which are employed to perform control functions in relation to the individual function generators 26 to 32, inclusive. Each of the OR-gates 40 to 48, inclusive, functions to provide a binary 1 output whenever a binary 1 is present at the particular digit level or a higher digit level. For example, if a binary 1 appears at any level from C8 on up to C13 a binary 1 output is developed by the OR-gate 48. However, when the C8 level and all higher levels are zero, then the output of the OR-gate 48 is also zero.

The illustrated ladder network has the property that when a maximum count signal corresponding to the digit level C11 occurs, i.e., when binary 1 signals appear on all of the terminals C1 to C11, inclusive, an output voltage is developed at the upper end of the ladder network, i.e., across the resistor 2 which is exactly two-thirds of the reference voltage, or minus 6 volts D.C. Furthermore, the analog voltage will increase linearly up to this same maximum voltage level as each of the levels of the ladder network is filled. Thus, for example, the voltage at the S7 level of the ladder network, corresponding to the C7 lead of the counter 14, will increase linearly to 6 volts when all the conductors C1 to C7, inclusive, have binary 1 signals thereon. When a 1 signal appears on C8 all of the C1–C7 signals are 0 and the voltage at the S7 level increases linearly again to 6 volts when 1 outputs appear on the C1–C7 conductors. The sawtooth voltage shown in FIG. 2(*a*) is thus developed on the S7 output conductor of the ladder network. At the same time, the voltages at higher levels of the ladder network are increasing and reach a maximum level of 6 volts at binary related times. Thus, the sawtooth wave form shown in FIG. 2(*b*) is developed at the S8 level of the network and reaches 6 volts after twice as many counts as S7. The wave form in FIG. 2(*c*) is generated at the S9 level, the wave form of FIG. 2(*d*) at the S10 level and the wave form of FIG. 2(*e*) across the resistor 20.

In accordance with the present invention, selected segments of the wave forms shown in FIGS. 2(*a*) to (*d*) are combined to provide a composite analog signal having a shape closely corresponding to the last quadrant of a sinusoid. By constructing the last quadrant rather than the first, the longest straight line portion at the S10 level, which lasts for 45°, can be utilized to simulate the portion of the sine wave as it approaches zero in which region the sine wave is closely approximated by a straight line. If the first quadrant were constructed, the 45° straight line portion produced at the S10 level would occur on the region where the slope of sine wave changes rapidly and the composite output would not approximate a sine wave nearly as closely.

In order to combine selected segments of these wave forms the output of the seventh level of the ladder network, i.e., the conductor S7, is supplied to the function generation network 26, the 8th level conductor S8 is connected to the function generator 28, the conductor S9 is connected to a function generator 30 and the conductor S10 to a function generator 32. The outputs of all of the function generator networks 26 to 32, inclusive, are connected in parallel to a common summation resistor 66 so that the incremental currents supplied by each network are summed in the resistor 66 to provide the desired composite analog signal in the form of the last ninety degrees of a sinusoid.

While the output of each level of the ladder network increases to a maximum of minus 6 volts when a maximum count occurs at that level, when a slightly larger count occurs the output of the lower levels would change back to zero. Accordingly, it is necessary to provide a fixed increment of voltage for the composite analog signal under all conditions where the count signal exceeds the maximum count at a particular level of the ladder network at which an increment is derived. For example, considering the C7 level, the output on the conductor S7 will be minus 6 volts when binary 1 signals are supplied to all the conductors C1–C7. However, the next higher count signal would be binary 10000000 which would mean that a binary 1 signal appears on the conductor C8 and binary zero signals appear on all of the conductors C1–C7. Under these conditions the voltage on the conductor S7 would drop back to zero whereas the voltage on this conductor should remain at minus 6 volts since the count is slightly larger than it was before and the function generation network 26 should continue to contribute the same increment of voltage to the composite analog signal.

In order to achieve this desired end result, the bound signals developed by the OR-gates 40 to 48, inclusive, are employed to control the function generation networks so that a constant voltage is developed by each network for all count signals having an amplitude greater than the level assigned to a particular function network. Also, these bound signals are employed to select the start of a particular sawtooth segment so that the composite wave form will have no changing voltage for the first few degrees corresponding to the region around 270° of a conventional sinusoid. Thus, considering the function network 26, the conductor S7 is supplied to the base of a transistor 68 the collector of which is connected to the common summation resistor 66. A resistor 70 is connected in series with the emitter of the transistor 68 to the collector of a control transistor 72 the emitter of which is connected to ground. The bounds conductor B8 is connected through a resistor 74 to the base of the transistor 72. The bounds conductor B9 is connected through a resistor 76 to the base of a transistor 78 the collector of which is also connected to the resistor 66. The conductor B9 is also connected through a resistor 80 to the base of another control transistor 82 the emitter of which is connected to ground and the collector of which is connected to the base of the transistor 72.

In the function generation networks of the present invention it is necessary to control the start of a selected segment as well as the point at which a constant voltage is maintained for the remainder of the quadrant. This is necessary in order to permit the combining of segments to achieve the desired composite wave form. Accordingly the signal on the B8 conductor is used in conjunction with the wave form appearing on the S7 conductor so as to control selection of the second segment 90 of the S7 wave form shown in FIG. 2(*a*) so that no voltage is produced during the first segment 92 of this wave form and an initial horizontal portion 94 of the composite wave form shown in FIG. 2(*f*) is formed followed by an initial sloping segment 96 corresponding to the segment 90 of the wave form shown in FIG. 2(*a*).

To this end, the bounds conductor B8 is employed as a starting signal to enable the function generator network 26 to start producing the sawtooth portion 90. A 1 signal appears on the B8 conductor when a corresponding 1 signal appears on the C8 conductor halfway through the full count at the C8 level. Accordingly, this 1 signal on the conductor B8 may be used to initiate the function generator 26 at the point indicated at 98 in FIG. 2(*a*) so that the ramp portion 90 is developed by the generator 26. More particularly, when a 1 signal appears on the conductor B8, this signal is coupled through the resistor 74 to the base of the transistor 72 and renders this transistor conductive so that the bottom end of the resistor 70 is connected to ground through the fully conductive transistor 72. Accordingly, the sawtooth portion 90 of the wave form in FIG. 2(*a*) is thereafter applied to the conductor S7 and hence to the base of the transistor 68 so that a corresponding increment of voltage is produced across the composite output resistor 66. The value of the resistor 70 is chosen so that the slope of this increment, which is the increment 96 of the composite wave form, is of the appropriate value to be summed with the other incremental segment to provide an analog output wave form closely approximating a sinusoid, as shown in FIG. 2(*f*).

When the count on the S7 conductor goes to zero for the second time as indicated by the trailing edge 100 in FIG. 2(*a*), a binary 1 signal occurs also on the B9 conductor and is employed to render the transistor 68 nonconductive while at the same time substituting a fixed value of current flow to the common resistor 66 which is maintained for the rest of the quadrant, as indicated by the dotted line 102 in FIG. 2(*f*) which represents this voltage level. More particularly, when a 1 signal appears on the conductor B9, this signal is transmitted through the resistor 80 to the base of the control transistor 82 and renders this transistor conductive. When the transistor 82 is thus rendered conductive, flow of current in its collector circuit biases off the control transistor 72 so that the transistor 68 is thereby rendered conductive. However, at the same time, the 1 signal on the B9 conductor is also transmitted through the resistor 76 to the transistor 78 and renders this transistor conductive. Accordingly, current flows through the transistor 78 having a value proportional to the value of the emitter resistor 84 of the transistor 78. The value of the resistor 84 is chosen so that it will give a level of current equal to the level 102 shown in FIG. 2(*f*) for the remainder of the quadrant. Since a 1 signal exists on the B9 conductor for all levels S9 or higher, it will be evident that the transistor 78 remains conductive at this fixed value of current for the remainder of the quadrant.

In a similar manner, the other function generation networks provide further segments of the composite wave form. Thus, the second sawtooth portion 104 of the wave form appearing on the conductor S8 (shown in FIG. 2(*b*) ) is selected by the generation network 28. More particularly, the 1 signal appearing on the conductor B9 is employed to initiate current flow through the transistor 68 at the point 106 shown in FIG. 2(*b*) so that the next segment 108 of the composite wave form shown in FIG. 2(*f*) is formed. The value of the resistor 70 in the network 28 is chosen so as to provide the correct slope for the composite wave form. At the end of the section 104, the signal on the B10 conductor is employed to switch conduction to the transistor 78 and the value of the resistor 84 in the network 28 is chosen to provide the fixed voltage level 110 (FIG. 2(*f*) ) for the remainder of the quadrant.

In a similar manner the network 30 functions to select the sawtooth segment 112 shown in FIG. 2(*c*), the 1 signal on the B10 conductor controlling initiation of conduction of the transistor 68 at the point 114 in FIG. 2(*c*) so that the segment 116 is formed during the next period of counting on the S9 conductor. The signal on the B11 conductor controls switching from the transistor 68 to the transistor 78 and the resistor 84 is chosen to have a value such that the current level 118 is maintained after the end of the sawtooth wave form segment 112 for the remainder of the quadrant cycle.

The last function generation network 32 is employed to select the sawtooth segment 120 shown in FIG. 2(*d*) of the wave form appearing on the S10 conductor, this segment being initiated at the point 122 shown in FIG. 2(*d*) by the signal on the B11 conductor. Accordingly, the value of the resistor 70 in the network 32 is chosen to give the composite segment 124 of the correct slope to provide the desired composite wave shape, between 45° and 90°. However, since the composite wave form is now at 90°, it is not necessary to maintain a fixed level of voltage at the end of the segment 124.

While the above described arrangement is suitable for providing a composite wave form having a shape which closely approximates the final quadrant of a sinusoid, it is also necessary in accordance with the present invention to reproduce the other three quadrants of the sinusoid so that a composite wave form extending over 360° is available for energization of the one or more synchro generators.

In accordance with a further important aspect of the present invention the direction of counting of the counter 14 is reversed during the next 90° while controlling the function generation networks 26 to 32, inclusive, as before. Thus, as shown in FIG. 3(*e*), the first 90° segment 130 of the composite wave form is developed in the manner described in detail heretofore during the period when the output of the counter 14 goes from 0 to 2047. During the next 90° while the output of the counter 14 goes from 2047 to 4095, the direction of counting applied to the ladder network and function generators is reversed. As a result, during the next ninety degrees the second segment 132 of the composite wave form is developed across the common output resistor 66. During the next ninety degree period the count supplied to the ladder network 18 to 24, inclusive, is changed back to the original direction so that the composite wave form segment 134 is produced and during the final 90° the counting direction of the count applied to the ladder network is again reversed so as to produce the final segment 136 of the composite wave form. The segments 132 and 134 are thereafter inverted, by means to be described in more detail hereinafter, so as to produce the segments **132*a* and 134*a* shown in dotted lines in FIG. 3**(*e*) so that a composite wave form which closely approaches a complete sinusoid is developed during the 360° corresponding to the total count of the counter 14.

Considering first the manner in which the direction of count supplied to the ladder network 18 to 24, inclusive, is reversed to provide the composite wave form segment 132, all of the XOR-gates 16 for the eleven levels of the ladder network are controlled in common by the signal appearing on the C12 conductor of the counter 14. Accordingly, when a 1 signal appears on the conductor C12, as shown in FIG. 3(*c*), the complement of the existing number is produced at the output of the XOR-gate 16 and during the first half of the C12 period when a 1 appears on the C12 conductor the count applied to the ladder network is reversed in direction and counts back down from a full count at the C11 level to zero in all levels. More particularly, when a full count appears at the C11 level all of the conductors C1 to C11 have 1 signals appearing on them and corresponding signals appear at the outputs of the XOR-gates 16. When a 1 signal appears on the C12 conductor the signals on the C1 to C11 conductors all change to " zero" but since a 1 signal is applied to one input of all of the XOR-gates, the output from these gates continues to be a 1 signal at each of the C1 to C11 levels. Accordingly, the ladder network has the full C11 count applied to it corresponding to the maximum value of the segment 124 in FIG. 2(*f*) and during the period when a 1 signal appears on the C12 conductor the analog wave form segment 132 (FIG. 3(*e*) ) is developed across the common resistor 66.

At 180° the C12 conductor again goes to "zero" and the original counting direction is restored so that the composite segment 134 is developed across the resistor 66 which is identical to the segment 130 produced during the initial 90°. When the C12 conductor again bears a 1 signal, during the period from 270° to 360°, the counting direction is again reversed and the analog wave form segment 136 is produced across the common resistor 66.

The composite wave form thus produced across the common resistor 66 is supplied to the base of a first transistor 140 and appears across the collector resistor 142 thereof. The signal appearing across the resistor 142 is applied to the base of an emitter follower transistor 144 and appears across the emitter output resistor 146 thereof which is connected to the center tap of a transformer 148 having two primary windings 150 and 152. The amplified composite wave form is thus connected to the common terminal of the windings 150 and 152. In order to reverse the polarity of the wave form segments 132 and 134 one or the other of the primary windings 150, 152 of the transformer 148 is selectively energized so that the wave form is inverted in polarity when it appears at the secondary winding 154 of the transformer 148. More particularly, the signals appearing on the C12 and C13 conductors are applied to an XOR-gate 156 the output of which is supplied through a resistor 158 to the base of a switching transistor 160 the emitter of which is connected to ground.

During the first 90 degrees of the composite wave form the signals on both the C12 and C13 conductors are "zero," as shown in FIGS. 3(*c*) and (*d*) and hence no output is derived from the XOR-gate 156. However, during the period from 90 to 180 degrees the C12 conductor has a 1 and the C13 has a "zero." Accordingly, a 1 output from the gate 156 is produced during this interval. In a similar manner during the third quadrant, i.e., from 180° to 270° the C12 conductor has a "zero" and the C13 conductor has a 1 and a corresponding 1 output is derived from the XOR-gate 156 during this quadrant also. Accordingly, during the second and third quadrants of the wave form shown in FIG. 3(*e*), the transistor 160 is rendered conductive.

The upper end of the winding 150 is connected to the collector of a transistor 162 the emitter of which is connected to a minus voltage source and the base of which is connected through the resistor 164 to this negative voltage. In a similar manner, the end of the winding 152 is connected to the collector of a transistor 166 the emitter of which is connected to the minus voltage and ıe base of which is connected through the resistor 168 ) this negative voltage.

A transistor 170 has its base connected through the ɛsistor 172 to the collected of the transistor 160 so ıat during periods when the transistor 160 is noncon-uctive, i.e., the period from 0° to 90° and from 270° to 60°, the transistor 170 is conducting and renders the ɛries transistor 162 conductive so that the wave form ppearing across the common resistor 146 is coupled to ıe winding 150. During this period the transistor 166 nonconductive so that no corresponding signal is supplied to the primary winding 152. However, when the ·ansistor 160 is rendered conductive the signal developed at the collector of this transistor is coupled ırough a resistor 174 to the base of a transistor 176 ıe emitter of this transistor being connected to ground nd the collector thereof being connected through the ɛsistor 178 to the negative voltage. The signal developed at the collector of the transistor 176 is also couled through a resistor 180 to a second transistor 182 ıe collector of which is connected through the resistor 84 to the base of the series transistor 166. When the witching transistor 160 is rendered conductive by the utput from the XOR-gate 156 as described hereto-ɔre, the transistor 176 is turned off thereby rendering ıe transistor 182 conductive so that the series transis-ɔr 166 is rendered conductive and current flows from ıe common resistor 146 through the other winding 52 of the transformer 148. At the same time the tran-istor 170 is rendered nonconductive so that the series :ansistor 162 is also rendered nonconductive and no urrent flows through the winding 150. With this ar-angement the wave form segments 132 and 134 ap-ear across the secondary winding 154 with inverted olarity so that the composite wave form comprising he sections 130, 132*a*, 134*a* and 136 is developed at he output terminals of the winding 154.

This composite signal which now closely resembles a omplete sinusoidal wave form may either be amplified ı a power amplifier or may be applied directly to one ır more synchro generators which are to be employed ɔ develop phase displaced outputs corresponding to ıechanical displacement of the input shaft thereof. 'referably, the signal developed across the winding 154 ; applied without amplification to the synchro genera-ors so that any slight shift in phase in amplifying this ıC signal is avoided. Thus, in the illustrated embodi-nent the signal developed across the winding 154 is ap-ılied to the phase one winding 190 of a synchro genera-or, this generator also having a 90° displaced phase wo winding 192 and a rotor winding 194 which is ro-atable with the input shaft 196 of the synchro, as will ıe readily understood by those skilled in the art.

In order to develop the phase two energizing voltage ɔr the 90° displaced synchro input, a ladder network ınd function generation arrangement 198 is provided. 'hese circuit components are identical to the phase ıne ladder network and function generators described ıeretofore except for the fact that the C13 conductor is pplied as one input to an XOR-gate 200 the output of vhich is employed as the C13 input to the ladder net-vork, which is identified as C13' in the drawing. also, he C12 conductor signal is applied through an inverter !02 to the C12' input to the ladder network, the C12 :onductor also being supplied to the XOR-Gate 200. Vith this modification the output of the composite vave form comprising the segments 130, 132*a*, 134*a* ınd 136 is simply shifted in phase by 90°, this output being developed across a secondary winding 204 of a transformer 206 corresponding to the transformer 148 in the phase one circuit. This 90° shift in the phase two output is provided by the XOR-gate 200 and inverter 202. This may be readily seen when it is realized that during the 0° to 90° portion of the wave form in FIG. 3(*e*) the C12 and C13 conductors have "zero" signals on them as shown in FIGS. 3(*c*) and (*d*). However, these "zero" signals when supplied to the XOR-gate 200 would provide a 1 signal at the C13' conductor. Also, the "zero" signal on the C12 conductor is inverted in the inverter 202 and appears as a 1 signal in the C12' conductor. The appearance of 1 signals on both the C12 and C13 conductors corresponds to the fourth quadrant of the composite wave form, i.e., the wave form segment 136 between 270° and 360°. A similar shift in phase is accomplished throughout the other three quadrants of the composite wave form so that the artificially constructed sinusoidal voltage applied to the winding 192 of the synchro generator is shifted in phase by 90° with respect to the wave form applied to the winding 190.

Considering now the manner in which the phase shifted sine wave which is developed across the rotor winding and is displaced in phase from the reconstructed sine wave, developed in the manner described in detail heretofore, in proportion to the physical displacement of the input shaft 196, the sinusoidal signal appearing across the rotor winding 194 is supplied to an operational amplifier 210 so that a square wave output signal appears on the output conductor 212 thereof which has leading and trailing edges corresponding to the zero crossover points of the sine wave developed across the rotor winding 194. Assuming that the input shaft 196 has been displaced by an amount X shown in FIG. 3(*f*), the sinusoidal wave appearing across the winding 194 is shown in this figure as the sine wave 214 and it will be noted that the zero crossover point of this wave is displaced from the zero crossover point of the composite wave form FIG. 3(*e*), which occurs at 90 degrees, by the indicated amount X. It will also be noted that the zero crossover point of the reference wave shown in FIG. 3(*e*) occurs at a point when the counter 14 has a count of 2047 on the output conductors thereof. Accordingly, in order to provide a digitized output for the synchro generator which will have a zero digital number corresponding to zero phase displacement of its input shaft, it is necessary to subtract continuously from the output of the counter 314 an amount equal to 2047 before the output of the counter 14 can be utilized to develop the desired digitized output position signal. To this end, a subtractor 216 is provided to which the thirteen output conductors C1 to C13, inclusive of the counter 14 are supplied, the output conductors of the subtractor 216, D1 to D13, inclusive, being supplied to the thirteen inputs of a holding register 218. The subtractor 216 is hard wired to provide a continuous subtraction of a count of 2047 from whatever count is developed on the conductor C1 to C13, inclusive, as will be readily understood by those skilled in the art.

The output of the operational amplifier 210 which appears on the conductor 212 corresponds to the square wave signal 220 shown in FIG. 3(*g*) and it will be evident that the leading edge 222 of this square wave occurs at the desired zero crossover point of the phase shifted sine wave 214. Accordingly, the signal on the conductor 212 is supplied to a differentiating circuit 224 which develops a sharp pulse 226 (FIG. 3(*h*) ) which is supplied at one input of an AND-gate 228 the other input of the AND-gate 228 being the phase B clock pulses which are supplied over the conductor 230. The phase B clock pulses appearing on the conductor 230 are 180° displaced from the phase A clock pulses which control the counter 14 so that the output of the AND-gate 228 cannot occur at any time when the output of the counter 14 is switching from one value to another. However, in between phase A counter pulses, the AND-gate 228 is energized by the zero crossover pulse 226 and an output from the gate 228 is applied over the strobe lead 232 to the input of the holding register 218 so as to cause this holding register to latch at the particular digital count then occurring on the conductors D1 to D13, inclusive.

It will be recalled that the count on the conductors C1 to C13, inclusive, is a count from which the number 2047 has been subtracted by the subtractor 216. Accordingly, a digital output is registered in the register 218 and appears on the output conductors E1 to E13, inclusive, thereof, corresponding to the digital value of the phase shift X shown in FIG. 3(*f*). Furthermore, this digital value of the phase shift, which is proportional to the physical displacement of the synchro input shaft 196, is extremely accurate because the sine wave which energizes the synchro generator has been artificially constructed from the output of the counter 14 which is also used to control the holding register 218. This digitized output of the synchro generator may then be used in any desired manner and provides an extremely accurate digital signal corresponding to the analog position of the input shaft 196.

While the arrangement of the present invention described thus far is of general application and may be employed in any situation where it is desired to digitize the position of the input shaft of a synchro generator, the arrangement of the present invention is particularly suitable for use in connection with the measurement of movement of the manipulator arm of a programmable manipulator wherein it is necessary to provide position information feedback which is digitized to a high degree of accuracy. Furthermore, in accordance with a further aspect of the invention, an arrangement is provided wherein measurement is made in a number of different axes by means of a plurality of synchro generators while employing a phase detector and holding register which are common to all axes. Furthermore, certain arrangements are provided to improve the accuracy with which the shaft position is digitized and to prevent undesired response to spurious noise impulses during the recording phase of the manipulator apparatus. Such an arrangement is shown in FIGS. 4(A) and 4(B) wherein portions of a programmed manipulator apparatus are shown which correspond generally to the arrangement described in detail in Dunne et al. U.S. Pat. No. 3,661,051 issued May 9, 1972. Reference may be had to said Dunne et al patent for a detailed description of the general operation of the manipulator apparatus. In FIGS. 4(A) and 4(B) an OUT-IN synchro generator 240 is employed to measure the OUT-IN movement of the manipulator arm, a rotary synchro 242 is provided to measure rotary movement of the manipulator arm, a DOWN-UP synchro 244 is provided to measure the DOWN-UP movement of the manipulator arm, a bend synchro 246 is provided to measure the wrist bend movement of the manipulator and a swivel synchro 248 is provided to measure wrist swivel movement of the manipulator hand attached to the manipulator arm. In said Dunne et al. U.S. Pat. No. 3,661,051 measurement in the five illustrated axes is accomplished by means of photoelectric encoders. However, in accordance with the present invention, the simple synchro generators 240 to 248, inclusive, are employed to measure movement in the five axes. Furthermore, each of these synchros is supplied with the phase 1 and phase 2 artificially constructed sinusoidal wave forms described in detail heretofore in connection with FIGS. 1(A) and 1(B) and the phase 1 and phase 2 sine waves are supplied to windings corresponding to the windings 190 and 192 of the synchro generator shown in FIG. 1(B), in parallel. The phase shifted rotor output signal from each synchro is supplied to an AND-gate to the other input of which is provided a multiplex wave form so that the sinusoidal outputs of all synchros as multiplexed to the input of a common phase detector 250. More particularly, an octal decoder 252 is provided to develop a series of sequential multiplex switching wave forms on the output conductors G1 to G8, inclusive, thereof, the octal decoder being controlled by three binary outputs of a 3-bit counter 254 so that for each cycle of the counter 254 a series of eight multiplex periods is established, five of these multiplex periods being employed to control switching of the synchro generators 240 to 248, inclusive, to the common input of the phase detector 250. Thus, the phase shifted sinusoidal outputs from the rotor of the synchro generator 240 is supplied by way of the conductor 256 to an AND-gate 258 the other input of this AND-gate being supplied by the multiplex wave form on the GI output conductor of the octal decoder 252. In a similar manner the phase shifted rotor output of the synchro 242 is supplied to an AND-gate 260, the output of the synchro 244 is supplied to an AND-gate 262, the output of the bend synchro 246 is supplied to an AND-gate 264 and the output of the swivel synchro 248 is supplied to the AND-gate 266, each of these last four AND-gates being supplied respectively by the G2 to G5 switching wave forms. As a result, each of the phase shifted outputs of the synchros 248, inclusive, is sampled during one of the five multiplex periods occurring during one cycle of the counter 254 and each multiplexed portion of the sinusoidal wave is supplied to the common phase detector 250. The phase detector 250 corresponds to the operational amplifier 210 and differentiation network 224 of the arrangement shown in FIG. 1 and hence provides a positive going pulse on the output conductor 268 thereof at the positive going zero crossover of each phase shifted sinusoidal wave form supplied to the input of the phase detector 250.

In order to synchronize the operation of the counter 254 with the artificially developed sine wave signals which are supplied to the synchros 240 to 248, inclusive, and also to provide an arrangement for rapidly registering and reading digitized signals corresponding to the sequentially developed pulses at the output of the phase detector 250, corresponding to each of the different synchros, the trailing edge of the wave form developed at the C13 conductor of the counter 14 is supplied to a divide by two circuit 270 so that a first output signal is developed on the conductor 272 of the divider which is positive during one cycle of the counter 14 and a second switching wave form is developed on the oppositely polarized output conductor 274 of the divider 270 during the next cycle of the counter 14. These switching wave forms are then employed to control application of the phase detector output pulses to either one of a pair of holding registers 276 or 278. More particularly, the output conductor 268 of the phase detector 250 is connected to an AND-gate 280 which also has as a second input the switching wave form on the conductor 274 and has a third input the phase B clock pulses developed by the basic clock 10. The gate 240 is enabled by the wave form on the conductor 274 during one cycle of the counter 14 and when the zero crossover pulse on the conductor 268 coincides with a phase B clock pulse an output is derived from the gate 280 which is supplied to the holding register 278. The holding register 278 is supplied with the input conductors D1 to D13, inclusive, which are developed by the common subtractor 216, as described in detail heretofore in connection with FIG. 1, it being recalled that the output of the subtractor 216 corresponds to the count of the counter 14 from which a fixed count of 2047 has been subtracted.

In a similar manner, the switching wave form on the conductor 272 is supplied as one input to an AND-gate 282, the zero crossover pulses on the conductor 268 being supplied as a second input to this gate and the phase B clock pulses being supplied as a third input thereto. Accordingly, the gate 282 develops an output during the next cycle of the counter 14 when the next zero crossover pulse occurs in synchronism with one of the phase B clock pulses, this output being supplied to the holding register 276. The register 276 is likewise supplied with signals on the subtractor output conductors D1 to D13, inclusive, and hence registers a digital signal corresponding to the time of occurrence of the zero crossover pulse with respect to the digital count developed by the counter 14.

If desired, the output of the phase detector 250 may be supplied to only one of the holding registers 276 or 278 and the digital output thereof recorded in a memory 286. However, in accordance with a further aspect of the invention, these two holding registers are employed to perform different functions during the record mode of operation of the manipulator apparatus and during the playback mode thereof. During the record mode of operation, the digital outputs of the two holding registers 276 and 278 are supplied to two multidigit inputs of a digital comparator 284 and when these numbers compare equally a signal is given to store the number registered in one of the registers, such as the register 276, in a memory 286. The memory 286 may comprise any suitable storage arrangement such as a woven or plated wire memory, or the like, and is controlled not only by the three outputs of the counter 254 which define a series of 8 multidigit storage positions corresponding to a single program step, but also by an address counter 288 which is controlled in a manner to be described in detail hereinafter so as to control the memory 286 in moving from one program step to another during the playback oeration. However, the address counter 288 and the counter 254 are controlled during the recording mode of the manipulator apparatus by means of a record button 290 so that after the manipulator arm has been moved to a desired position, and the record button 290 depressed, the output of all of the synchros 240 to 248, inclusive, will be sampled and digitized in sequence, the digital number stored in both holding registers 276 and 278, and if these numbers agree then the number stored in the register 276 is recorded in the memory 286. With such an arrangement, if noise pulses appear on the common input to the phase detector 250 which input comprises portions of sinusoidal wave forms from each of the five synchros, these noise impulses could cause a slight displacement of the zero crossover pulse 268 from one cycle to the next of the counter 14. However, such a slight phase shift would cause different numbers to be recorded in the holding registers 276 and 278. Accordingly, no number would be recorded in the memory 286 until the digital outputs of these two holding registers are identical.

Considering now more particularly the operation of the system described above during the record mode of operation of the manipulator apparatus, when the record button 290 is depressed, a signal is supplied through a capacitor 292 to the set input of a flip-flop 294 so that an output signal is developed on the output conductor 296 of the flip-flop continuously after the record button has been initially depressed and released. During the teaching or record mode of operation the input to the counter 254 is controlled in accordance with the output of accuracy control circuits 298 which are described in detail in said Dunne et al. U.S. Pat. No. 3,661,051. While reference may be had to said Dunne et al. patent for a detailed description of these accuracy control circuits, it may be stated generally that the multidigit output of the comparator 284 is supplied to a digital-to-analog converter 300, the output of this digital-to-analog converter being sequentially supplied to direction and distance circuits corresponding to each of the five controlled axes during each of the first five multiplex periods G1 to G5 established by the octal decoder 252. Thus, during the G1 multiplex period a plus or minus signal is supplied through one of the AND-gates 302 or 304 to the out-in direction and distance circuit 306 and the analog error signal is supplied through the gate 308 to a storage capacitor 310, this error signal normally corresponding to the difference between a command signal stored in the memory 286 and the actual out-in position of the manipulator arm, as described in said Dunne et al patent. The output of the circuit 306 is employed to control the out-in servo valve 312 so that the manipulator arm is moved to reduce the analog error signal to zero. In a similar manner the output of the digital analog converter 300 is supplied to the other four direction and distance circuits, only the fifth such circuit, i.e., the swivel direction and distance circuit 314 and its associated servo valve 316 being shown in FIG. 4(B). In this connection it will be understood that the above-described operation of the digital-to-analog converter 300 and its associated circuits is performed during the playback mode of operation in the Dunne et al. patent, whereas in accordance with the present invention the digital-to-analog converter 300 is employed during the record mode of operation to develop an error signal representing the difference between the two register outputs supplied from the registers 276 and 278 to the input of the comparator 284. During this record mode of operation the outputs of the circuits 306, 314 are disconnected from the respective servo valves 312, 316 by sections of the teach-repeat switch 318 so that the manipulator arm is not moved by the output of the comparator 284 during the teaching mode.

The digital output of the holding register 276 is supplied through the teach terminal of one section **318*a* of a multi-section teach-repeat switch 318 to one input of the comparator 284 and the output of the holding register 278 is supplied through a second section 318*b* of the teach-repeat switch to the other input of the comparator 284. Assuming that the output of the out-in synchro 240 is being sampled during the Gl multiplex period, the zero crossover pulse output of the phase detector 250 is sampled during two successive counter cycles of the counter 14 and is stored as two digital numbers in the registers 276 and 278 during two successive cycles of the counter 14, these digital outputs being compared by the comparator 284**.

As described in detail in said Dunne et al patent when the command and encoder signals are identical the out-in direction circuit 306 provides a so-called accuracy 1 signal which is supplied to the accuracy control circuits 298. Similar output signals are supplied from the other four direction circuits, as indicated by the conductors 320–322. These accuracy 1 signals are supplied to a five input AND-gate in the accuracy control circuits 298 so that when coincidence occurs in all five axes an output is developed on the accuracy 1 output conductor 324. However, in accordance with the present invention, the individual accuracy 1 signals developed by the direction circuits 306, 314, etc. are employed to indicate when the outputs of the two holding registers 276 and 278 are identical and when these two numbers are identical a signal is supplied to the counter 254 to step this counter to the next position so that the next multiplex period G2 is selected. More particularly, the accuracy 1 output from the out-in direction circuit 306 is supplied to an AND-gate 326 to which is also supplied the G1 pulse developed by the octal decoder 252. In a similar manner the accuracy 1 output of the swivel direction circuit 314 is supplied to an AND-gate 328 to which is also supplied the G5 multiplex pulse from the decoder 252. Accordingly, during the first or G1 multiplex period the AND-gate 326 develops an output when the ouputs of the two registers 276 and 278 coincide and an accuracy 1 signal is developed by the out-in direction circuit 306. The output from all five of the AND-gates 326–328 are connected together and supplied as one input to an AND-gate 330 to the other input of which is supplied a pulse corresponding to two cycles of the counter 14. This pulse is derived from the switching wave form on the conductor 274 through a differentiation network comprising the series capacitor 332 and shunt resistor 334.

A pulse is thus supplied to the input 336 of the AND-gate 330 once every two cycles of the counter 14 and if during these two cycles of the counter 14 the same number has been stored in both registers 276 and 278 an accuracy 1 signal would also be supplied from the AND-gate 226 to the other input of the AND-gate 330. The AND-gate 330 develops an output which is supplied to an AND-gate 338 the other input of which receives the output from the flip-flop 294 on the conductor 296. Accordingly, if the record button has been depressed so that the flip-flop 224 is set the AND-gate 338 then develops an output which is supplied through the switch section 318*c* of the teach-repeat switch 318 and through a delay network 340 to the input of the counter 254.

At the same time that the output from the AND-gate 338 is supplied through the switch section 318*c* to the counter 254, an output from this AND-gate is supplied through the switch section 318*d* of the teach-repeat switch 318 to the load terminal of the memory 286 so that a signal is supplied to the memory 286 which commands this memory to record the output registered in the holding register 276 corresponding to the digitized position of the out-in synchro 240, this signal being supplied through the switch section 318*e* of the teach-repeat switch 318. In this connection it will be understood that the output of the holding register 276 comprises a series of 13 conductors so that the switch section 318 is actually a multipoint switch supplying individually the signals appearing on the 13 output conductors of the holding register 276 to the input of the memory 386 when a load signal is supplied from the output terminal 344 of the switch section 318*d*.

The counter 254 is thus stepped to the next position after the delay provided by the circuit 340 so that the G2 enabling wave form on the G2 conductor is developed by the octal decoder 252. This signal then enables the AND-gate 260 so as to supply the phase shifted wave form developed by the rotary synchro 242 to the input of the phase detector 250 during the next two cycles of the counter 14. The zero crossover pulses developed during these next two counter cycles are stored in the registers 276 and 278, are compared in the comparator 284, and if they are identical an accuracy 1 signal is developed by the AND-gate 342 which is supplied through the AND-gate 330 at the end of the next two counter cycles and through the enabled AND-gate 338 to the counter 254 so that this counter is stepped to the G3 position.

In a similar manner the other three synchros 244, 246 and 248 are sampled during the G3 to G5 multiplex periods and the digital values successively registered in the holding register 276, when confirmed by the number in the holding register 278 are recorded in the memory 286.

When all five of the synchro signals have been digitized, the two outputs of the holding registers 276 and 278 compared in the comparator 284, and the digitized number stored in the memory 286, it is necessary to step the counter 256 through the three remaining multiplex periods G6 to G8 to complete one cycle of the counter 254. In this connection it will be understood that the last three multiplex periods G6, G7 and G8 can be employed to provide different auxiliary signals, such as the accuracy 1, accuracy 2 or accuracy 3 signals, a clamp signal, a jog signal, an end of program signal, a wait external signal or any other auxiliary signals, as described in detail in said Dunne et al patent. Since the AND-gate 330 receives no input after the G5 multiplex period, it is necessary to provide some means for stepping the counter 254 through the three remaining multiplex periods. This function is accomplished by a three input OR-gate 346 which has as its input pulses appearing on the G6, G7 and G8 conductors. The output of the OR-gate 346 is supplied to the AND-gate 338 which continues to be enabled by the flip-flop 294 so that when a pulse appears on the G6 conductor it is supplied through the AND-gate 338, the switch section 318*c*, and the delay network 340 to the input of the counter 354.

When the counter is thus stepped through the last three remaining multiplex periods, an output is developed on its most significant digit conductor 348 which is supplied by way of the conductor 350 to the reset terminal of the flip-flop 290 so that this flip-flop is reset after all of the positions in the five controlled axes have been recorded in the memory 286 as described in detail above. The signal on the conductor 348 is also supplied through a teach-repeat switch section 318*f* to the advance terminal 350 of the address counter 288 so that the memory 286 is stepped to the next set of address ›ositions corresponding to the next set of signals in the :ight multiplex periods G1 to G8, inclusive. The manipılator arm is then moved to the next desired position, .s described in detail in said Dunne et al patent and .fter the arm has been moved to the desired position, he record button 290 is again depressed whereupon he entire sequence of sampling of the synchro signals, toring in the register 276, 278, comparing, and recordng in the memory 286 is repeated as described in detail ıeretofore. When the last program step is recorded in he memory 286 an end of program pulse is recorded .uring one of the auxiliary multiplex periods G6, G7, ;8 as described generally in said Dunne et al patent, hereby indicating that the program should be repeated t this point in the playback series of operations.

Considering now the manner in which the outputs rom the synchros 240 to 248 is employed during the ·layback mode of operation of the manipulator appara-ɹs of the present invention, it will be understood that uring this mode of operation all of the sections of the :ach-repeat switch 318 are thrown to the repeat posiıon so that the counter 254 is no longer controlled by utput pulses developed by the AND-gate 338. In acordance with an important aspect of the invention, the ounter 254 is controlled during playback by the pulses ppearing on the C13 lead of the counter 14 so that the ıree bit counter 254 is stepped at twice the rate that it /as during the record mode of operation. This means ıat the multiplex periods G1 to G8 will occupy aproximately 1 millisecond each since the basic clock 10 ; operated at a frequency of approximately 8 megacyles so that the 13-bit binary counter has a total cycle me of approximately 1 millisecond.

In accordance with a further aspect of the invention, ıe two holding registers 276 and 278 are employed uring playback to store digitized signals representing ʌo different synchros so that while one synchro signal ; being digitized in one register the output of the other :gister may be applied to the comparator 284 and ompared with the corresponding command signal for ıat axis. To this end, the C13 conductor is connected ) the switch section 318*c* so that in the repeat position f this switch C13 pulses are continuously supplied to ıe input of the three-bit counter 254. By employing ıe two registers 276 and 278 alternately to digitize a /nchro signal or up date an already digitized signal, nd then supplying the digitized signal to the compara-)r while the other register is being updated, the freuency at which the synchros are updated is substanally increased over an arrangement where the counter 54 is stepped at the rate of two counter cycles.

Since the counter 14 is controlled by the basic clock 3 which has a frequency of eight megacycles, the total me for one cycle of the counter 14 is approximately 1 ıillisecond so that the artificially developed sine waves hich are employed as the phase 1 and phase 2 signals ır the synchros 240 to 248, have a frequency of ap-:oximately 1,000 cycles per second. When the )unter 254 is energized by the C13 pulses each synıro is updated once every 8 milliseconds which prodes sufficiently close updating that the manipulator ·m may be accurately controlled and moved to the )mmanded position. In this connection, it will be un-:rstood that if the synchro excitation frequency is too gh, the response will be poor whereas if this freɹency is too low, the system is so slow acting that the anipulator arm cannot be controlled accurately to ove to the desired position.

Considering now the operation of the manipulator system of the present invention during the playback mode and assuming that the counter 254 is set to its initial position at which a multiplex pulse is produced on the G1 conductor corresponding to the first axis of the first program step in the memory 286, the phase shifted output signal developed by the out-in synchro 240 is sampled during the G1 multiplex period which now lasts for only the duration of one cycle of the counter 14 since the three-bit counter 254 is now being controlled from the C13 conductor and hence changes the output of the octal decoder 252 at twice the rate as during the record or teach mode of operation.

During the G1 multiplex period on playback, the output of the AND-gate 258 is supplied to the phase detector 250 and the zero crossover pulse developed on the output conductor 268 thereof is supplied to the AND-gate 282 and during the first counter cycle this AND-gate is enabled by the signal on the conductor 272 so that the holding register 276 is set at a value corresponding to the position of this zero crossover pulse. During the G2 multiplex period, the rotary synchro phase shifted signal is sampled by the AND-gate 260 and supplied to the common phase detector 250. However, this phase detector is now supplied to the holding register 278 since the AND-gate 280 is now enabled by the signal on the conductor 274 of the divide by 2 circuit 270. Accordingly, the zero crossover pulse corresponding to the position of the rotary synchro is registered in the register 278 during the second multiplex period G2. As this is occurring, and in accordance with an important aspect of the present invention, the output of the register 276 is supplied to the comparator 284 and the memory signal developed on the conductor 352 is arranged to correspond to the recorded command signal during the G1 multiplex period during the teaching mode. To this end, a series of AND-gates 354 are individually connected to the output conductors of the holding register 276 and these AND-gates 354 are controlled by the switching wave form on the conductor 274. The output of these AND-gates are supplied to the individual inputs of one side of the comparator 284 through the switch section 318*g* of the teach-repeat switch, it being understood that this switch section is a multi-point section having individual conductors for each one of the AND-gates 354.

In order to delay actuation of the memory 286 so that this memory is supplying a command signal on the conductors 352 to the comparator 284 during the G2 multiplex period which corresponds to the signal initially recorded during the G1 period, a 3-bit binary subtractor 356 is provided between the three output conductors of the 3-bit counter 254 and the corresponding input conductors of the memory 286. The 3-bit binary subtractor is controlled by the teach-repeat switch section 318*h* and during the teaching mode a ground signal is supplied to the subtractor 356 so that it does not change the output signals which are developed by the 3-bit counter 254 but merely sends these signals on the memory 286. However, in the repeat mode of operation the switch section 318*h* provides a plus 5 volt signal to the subtractor 356 and this subtractor subtracts one binary bit from the count existing at the output of the 3-bit counter 254. Accordingly, when the count at the output of the counter 254 is effective to establish the G2 multiplex period, so that the rotary synchro 242 is sampled, the 3-bit binary subtractor 356 is effective to subtract 1 bit from this output signal so that the memory circuit 286 actually sees an output from the counter 254 corresponding to the first position of this counter or in other words the G1 multiplex period. Accordingly, the memory 286 responds by supplying the command signal recorded during the G1 period to the output conductors 352. Therefore, during the period when the output of the register 276 is being supplied to the comparator 284, the memory 286 is also effective to supply the corresponding out-in command signal to this comparator. The command and register signals are compared in the comparator and any error signal is supplied to the digitial-to-analog converter 300 where it is effective to control the out-in direction and distance circuit 306 so that the servo valve 312 starts to move in the correct direction to reduce this error signal. Furthermore, this analog error signal is stored in the capacitor 310 while the other four axes of the manipulator are sampled.

The holding register 278 was loaded during the G2 multiplex period through the AND-gate 280, as described above. During the G3 multiplex period the output of this holding register is supplied to the comparator in place of the output of the register 276 so that it can be compared with the rotary command signal which is being supplied from the memory 286. To this end, a series of AND-gates 358 are connected to the individual output conductors of the register 278, these AND-gates being also controlled by the switching wave form on the conductor 272. The output of the AND-gates 358 are supplied through the multipoint switch sections **318*b* of the teach-repeat switch to one input of the comparator 284. Accordingly, while the holding register 276 is being set to a value corresponding to the position of the down-up synchro 244 during the G3 multiplex period, the output of the register 278 is being supplied to the comparator 284 where it is compared with the rotary command signal developed by the memory 286. In this connection it will be understood that the 3-bit binary subtractor 356 functions continuously to subtract 1 bit from the output of the counter 254 so that the memory 286 is always supplying a command signal corresponding to the immediately preceding multiplex period to the comparator 284.**

In a similar manner the other synchros measuring movement in the other controlled axes of the manipulator are sequentially sampled and thereafter applied to the input of the comparator 284 during the remaining multiplex periods. The converter 300 supplies suitable signals over the conductors 360 to the accuracy control circuits 298 so that a total accuracy control signal corresponding to the desired accuracy with which the manipulator arm is to be moved to the commanded position in all axes is developed by the circuits 298, as described in detail in said Dunne et al. patent. In this connection it will be understood that the counter 254 continues to respond to the C13 pulses and continually steps the decoder 252 through the series of eight multiplex periods until movement in all of the controlled axes has been performed in accordance with the command signals corresponding to each axis. When the manipulator arm has been moved to the desired position, and with the desired accuracy, an output signal is developed on one of the three output conductors 324, 362 or 364 of the accuracy control circuits 298, depending upon the desired accuracy which has been programmed during the teaching operation and as described in detail in said Dunne et al. patent. An output signal in any one of these conductors is supplied through the OR-gate 586 to an AND-gate 780 to which other controlling signals, such as wait-external, operate-external, etc. are supplied. When all of these functions have been performed and movement has been accomplished to the desired command position, a total coincidence signal is developed on the conductor 366 which is supplied to one input of an AND-gate 368. The signal developed when the three-bit counter 256 is filled is also supplied by way of the conductor 348 to another input of the AND-gate 368. Also, the signal derived from the memory 286 corresponding to the end of program is supplied through an inverter 370 as the third input of the AND-gate 368. When no end of program signal exists, this third input to the AND-gate 368 is enabled so that the AND-gate 368 develops an output signal when a total coincidence signal appears on the conductor 368 and the counter 254 has been filled, indicating that all eight multiplex periods have been completed. When this occurs the output from the AND-gate 368 is supplied through the teach-repeat switch section **318*f* and the conductor 350 to the advance lead of the address counter 288 so that the memory is stepped to the next group of addresses corresponding to the next recorded program step. The new memory command signals are then compared with the digitized synchro outputs in the manner described in detail heretofore and the manipulator arm is then moved to a position such that a total coincidence signal appears on the conductor 366.**

This operation continues until the last program step in the memory 286, at which an end of program signal has been recorded. When an end of program signal is encountered, the inverter 370 blocks the AND-gate 368 even though a total coincidence signal is produced on the conductor 366 so that the address counter 288 is not further advanced. Also, this end of program signal is supplied as one input to an AND-gate 372 the other input of which is the total coincidence signal on the conductor 366. Accordingly, when total coincidence at the last program step is encountered an output from the AND-gate 372 is supplied to the reset terminal of the address counter 288 so that this counter is reset to zero. The counter 254 continues to be controlled by the C13 pulses so that it immediately starts in with the first multiplex position of the first program step and the taught cycle of operations is continuously repeated by the manipulator arm.

While there have been illustrated and described various embodiments of the present invention, it will be apparent that various changes and modifications thereof will occur to those skilled in the art. It is intended in the appended claims to cover all such changes and modifications as fall within the true spirit and scope of the present invention.

What is claimed as new and desired to be secured by Letters Patent of the United States is:

1. In an analog-to-digital converter, the combination of, a counter having a plurality of output conductors on which the respective digits of the count thereof appear, pulse generating means connected to said counter for continuously varying the count thereof, a ladder network successive levels of which are connected to different ones of said output conductors and arranged simultaneously to develop linearly increasing signals at said successive levels of said ladder network as the count of said counter changes in a predetermined direction, summing means for said linearly increasing signals and arranged to develop an output waveform comprising a series of straight line segments corresponding to said successive levels of said ladder network and simulating a sinusoidal wave, said output waveform having zero crossover points in exact coincidence with predetermined digital outputs of said counter, synchro means having an input shaft whose position is to be indicated digitally, means for connecting said output waveform to said synchro means to energize the same, means for deriving from said synchro means an output signal corresponding to said output waveform and displaced therefrom by an amount corresponding to the position of said input shaft, means for developing a control pulse coincident with a predetermined point on said output signal, and register means controlled jointly by the output of said counter and said control pulse for developing a digital output corresponding to the occurrence of said control pulse.

2. The combination of claim 1, which includes means for complementing the output count of said counter and supplying said complemented count to the levels of said ladder network so that said output waveform increases during a first counting interval of said counter and decreases during a second counting interval thereof.

3. The combination of claim 2, which includes an output circuit, and means for supplying the waveform developed by said ladder network to said output circuit with one polarity during first and second counting intervals of said counter and with the opposite polarity during third and fourth counting intervals of said counter.

4. The combination of claim 1, wherein said ladder network has a plurality of input terminals and an output terminal, an exclusive OR-gate for each of said input terminals and having its output connected thereto, means connecting the output conductors of said counter corresponding to a predetermined number of digits thereof respectively to one input of said OR-gates, means connecting the output conductor corresponding to the next higher digit to the other input of all of said OR-gates, whereby the count supplied to said input terminals increases when said next higher digit has one value and decreases when said next higher digit has a different value.

5. In an analog-to-digital converter, the combination of, a counter, pulse generating means connected to said counter for continuously varying the count thereof, said counter having a plurality of output conductors on which the respective digits of the count simultaneously appear, a resistance summing network having a plurality of input terminals and an output terminal, an exclusive OR-gate for each of said input terminals and having its output connected thereto, means connecting the output conductors of said counter corresponding to a predetermined number of digits thereof respectively to one input of said OR-gates, means connecting the output conductor corresponding to the next higher digit to the other input of all of said OR-gates, whereby the count supplied to said input terminals increases when said next higher digit has one value and decreases when said next higher digit has one value and decreases when said next higher digit has a different value, a transformer having a center tapped input winding, means connecting said output terminal to the center tap of said winding, synchro means having an input shaft whose position is to be indicated digitally, an output circuit connected to said synchro means and including winding means on said transformer, means controlled by said counter for supplying the waveforms developed across the two halves of said center tapped winding to said output circuit, means for deriving from said synchro means an output signal corresponding to said waveforms and displaced therefrom by an amount corresponding to the position of said input shaft, means for developing a control pulse coincident with a predetermined point on said output signal, and register means controlled jointly by the output of said counter and said control pulse for developing a digital output corresponding to the occurrence of said control pulse.

6. The combination of claim 5, wherein said means for supplying waveforms to said output circuit is controlled in part by the signal on the output conductor of said counter immediately above said next higher digit conductor.

* * * * *